(12) United States Patent
Martin et al.

(10) Patent No.: US 10,790,771 B2
(45) Date of Patent: Sep. 29, 2020

(54) METHOD FOR DETERMINING A DROOP RESPONSE PROFILE OF A ELECTRICAL MACHINE CONNECTED TO AN ELECTRICAL GRID

(71) Applicant: GE ENERGY PRODUCTS FRANCE SNC, Belfort (FR)

(72) Inventors: Denis Michel Martin, Vieux Charmont (FR); Sébastien Philippe Grosshans, Sermamagny (FR)

(73) Assignee: GE ENERGY PRODUCTS FRANCE SNC, Belfort (FR)

(*) Notice: Subject to any disclaimer, the term of this patent is extended or adjusted under 35 U.S.C. 154(b) by 112 days.

(21) Appl. No.: 15/838,567

(22) Filed: Dec. 12, 2017

(65) Prior Publication Data

US 2018/0167008 A1  Jun. 14, 2018

(30) Foreign Application Priority Data

Dec. 14, 2016 (FR) .................................... 16 62419

(51) Int. Cl.
*H02P 9/04* (2006.01)
*H02P 9/44* (2006.01)
(Continued)

(52) U.S. Cl.
CPC .................. *H02P 9/04* (2013.01); *G01P 3/44* (2013.01); *G01R 31/34* (2013.01); *H02J 3/38* (2013.01);
(Continued)

(58) Field of Classification Search
CPC ... G01P 3/44; G01R 31/34; H02J 3/38; H02P 9/04; H02P 9/44; F05D 2270/61; F05D 2270/02; F05D 2270/061
(Continued)

(56) References Cited

U.S. PATENT DOCUMENTS 4,952,852 A * 8/1990 Bando ...................... H02H 7/06
318/140
5,468,126 A * 11/1995 Lukich .................... F02D 29/04
123/383

(Continued)

OTHER PUBLICATIONS

Burns McDonnell, Frequency Droop Consideration, 2015 (Year: 2015).*

(Continued)

*Primary Examiner* — Jorge L Carrasquillo
*Assistant Examiner* — Devon A Joseph
(74) *Attorney, Agent, or Firm* — James W. Pemrick; Charlotte C. Wilson

(57) ABSTRACT

A method for determining a droop response profile of a rotating electrical machine supplying electricity to an electrical grid having a network frequency varying on either side of a nominal frequency, in which a measured value of the rotation speed of the rotating machine is retrieved, and the droop response parameters dependent on the measured speed value are defined.

The droop response profile is a graph centered on the coordinates of an origin point between 99% and 101% of the measured speed and defined by at least two points of coordinates in the case of underspeed and/or by at least two points of coordinates in the case of overspeed, each of the points having for its abscissa a speed value as a percentage of the measured speed, and for the ordinates, a filtered speed value as a percentage of the measured speed modulated by at least one of the droop response parameters.

17 Claims, 3 Drawing Sheets

(51) Int. Cl.
*H02J 3/38* (2006.01)
*G01P 3/44* (2006.01)
*G01R 31/34* (2020.01)

(52) U.S. Cl.
CPC ............ *H02P 9/44* (2013.01); *F05D 2270/02* (2013.01); *F05D 2270/061* (2013.01)

(58) Field of Classification Search
USPC ........................................................ 318/400
See application file for complete search history.

(56) References Cited

U.S. PATENT DOCUMENTS

| | | | | |
|---|---|---|---|---|
| 5,605,130 | A * | 2/1997 | Dykstra | F02D 31/007 123/361 |
| 6,118,187 | A * | 9/2000 | Hepner | H02P 9/04 290/40 B |
| 6,873,125 | B2 * | 3/2005 | Seima | H02P 27/08 318/400.09 |
| 7,746,014 | B2 * | 6/2010 | Maeda | H02P 6/06 318/400.09 |
| 8,463,451 | B2 * | 6/2013 | Kumula | F01D 15/10 700/294 |
| 9,966,762 | B2 | 5/2018 | Markowz et al. | |
| 10,205,414 | B2 * | 2/2019 | Desabhatla | H02J 3/00 |
| 2002/0158600 | A1 * | 10/2002 | Seima | H02P 6/085 318/727 |
| 2008/0290666 | A1 * | 11/2008 | Bourgeau | H02P 9/006 290/40 A |
| 2010/0192907 | A1 * | 8/2010 | Stemler | F02D 41/0205 123/350 |
| 2010/0193489 | A1 * | 8/2010 | Beeson | B23K 9/1056 219/133 |
| 2010/0194118 | A1 * | 8/2010 | Radtke | B23K 9/10 290/40 B |
| 2010/0194356 | A1 * | 8/2010 | Fosbinder | B23K 9/1006 322/25 |
| 2011/0236486 | A1 * | 9/2011 | Giammona | A61P 17/02 424/488 |
| 2012/0152583 | A1 * | 6/2012 | Yanagihara | H02P 6/002 173/217 |
| 2014/0001756 | A1 * | 1/2014 | Panosyan | H02K 49/046 290/7 |
| 2014/0260293 | A1 * | 9/2014 | Chen | F02C 9/00 60/773 |
| 2015/0377057 | A1 * | 12/2015 | Desabhatla | G05B 15/02 700/287 |
| 2016/0222816 | A1 * | 8/2016 | Chen | F01D 17/04 |
| 2017/0093312 | A1 * | 3/2017 | Hano | H02P 27/08 |
| 2017/0141713 | A1 * | 5/2017 | Mori | H02P 23/14 |
| 2018/0106200 | A1 * | 4/2018 | Pipho | A01B 69/008 |
| 2019/0027933 | A1 * | 1/2019 | Lian | H02J 3/24 |

OTHER PUBLICATIONS

Frequency Droop Considerations, Burns Mc Donnell, Don Lueckenotte and Joseph Littich, PE, Oct. 4, 2017 (12 pages).

* cited by examiner

METHOD FOR DETERMINING A DROOP RESPONSE PROFILE OF A ELECTRICAL MACHINE CONNECTED TO AN ELECTRICAL GRID

FIELD OF INVENTION

The invention generally relates to rotating machines generating electricity to meet the electricity needs of an electrical network.

In particular, this invention relates to the control of such rotating machines.

BACKGROUND

An electrical grid must ensure a constant equilibrium between the consumption and production of electricity. However, an increase in electrical consumption causes a decrease in the frequency of the electrical grid, and conversely, a decrease in electrical consumption causes an increase in the frequency of the electrical grid. To ensure a constant balance between power consumption and power generation, the power of all power-generation groups is varied to maintain the frequency of the electrical grid, e.g. at 50 Hz. The power provided by each power-generation group is defined by its own droop. The term "droop" means the ratio between the power variation which tends to oppose the frequency variation.

The use of renewable energies also changes the stability of the electrical grid. Thus, power-generation groups are led to change their droop response profile according to variations in the frequency of the electrical grid.

There are also electrical grids that require different behaviors of a power-generation group when the electrical grid is operating in over-frequency or operating in under-frequency. The droop response profile of such a power-generation group is usually called an "asymmetrical droop response profile".

In order to limit the frequency instabilities associated with electrical grid compensations, it is necessary to define a dead band within which the power-generation group will not contribute to the maintenance of the frequency, despite a continuous variation of the frequency of the electrical grid.

The range of the dead band can be determined either by the energy producer or by the operating rules of the electrical grid defined in the transmission network operator (TSO). The transmission network operator may also specify parameters defining the behavior profile of the power-generation group, e.g. the output behavior of the dead band, the droop of the power-generation group, or the droop limiter.

In this respect, reference may be made to U.S. Pat. No. 6,118,187 which discloses a method for implementing a dynamic dead band for managing a dynamic frequency of an electrical grid in terms of frequency and amplitude.

We can also refer to the document US 2014 260 293 which discloses a gas-turbine regulating device comprising a droop response system designed to detect one or more operating characteristics of the turbine, e.g. the variation of the frequency of the turbine. For this purpose, the regulating device comprises a multivariate correction method based on operating characteristics, e.g. the load drift dependent on the percentage of the speed, the percentage of the frequency of the turbine and the drift of the ambient temperature at the compressor inlet of the turbine. The correction method thus generates a series of correction factors for the droop response and makes it possible to obtain a graph of the behavior of the turbine with a correction on the ambient temperature as a function of the inlet temperature of the turbine compressor.

BRIEF DESCRIPTION OF THE INVENTION

However, the known methods for configuring the droop response of a rotating machine do not allow the automatic integration of several functions, e.g. the dead band, the droop of the power-generation group, the output of the dead band or the limitation of the droop response to determine a response profile of the rotating machine to variations in speed. A value of 100% speed corresponds to 50 Hz or 60 Hz depending on the country.

An embodiment of the invention thus aims to overcome the above-mentioned disadvantages and provide a method for defining a droop response profile of a power-generation group capable of responding to frequency variations of an electrical grid.

An embodiment of the invention relates to a method for determining a droop response profile or speed profile of a rotating electrical machine supplying electricity to an electrical grid having a network frequency varying on either side of a nominal frequency, in which a measured value of the rotation speed of the rotating machine corresponding to the image of the frequency of the electrical grid is retrieved, and the droop response parameters dependent on the measured speed value are defined.

The droop response profile is a graph centered on the coordinates of an origin point between 99% and 101% of the measured speed, in an embodiment equal to 100% of the measured speed, and defined by at least two points in case of underspeed and by at least two points in case of overspeed. The abscissa of each of the points is a value as a percentage of the measured speed, and the ordinates are a filtered speed value as a percentage of the measured speed modulated by at least one of the droop response parameters. The value of the filtered speed will impact the fuel-control loop.

Said parameters comprise at least the value of the high dead band and the low dead band on either side of the original coordinate point, the value of the low, median and high droop of the rotating machine, the value of the low and high droop limiter, at least one dead band output mode, and the value of the low and high break point of the nonlinear droop.

The coordinates of a first point are calculated in the case of underspeed, corresponding to the low dead band, having an abscissa equal to the subtraction of 100% of the measured speed from the value of the low dead band, and having the ordinates equal to 100% of the measured speed.

To define the dead band output, we calculate the value of a median droop gain and the value of low droop gain. The droop gain corresponds to the ratio between the intrinsic droop of the rotating machine, e.g. of 4%, divided by the desired droop.

For example, for a desired droop of 4%, the corresponding gain is 1 (4%/4%). Thus, for a measured real speed delta of 0.2% at the output of the dead band, the filtered speed delta will be 0.2%.

Moreover, for a desired droop of 2%, the corresponding gain is 2 (4%/2%). Thus, for a measured speed delta of 0.2% at the output of the dead band, the filtered speed delta will be 0.4%.

For example, the coordinates of a second point are calculated in the case of underspeed, corresponding to the output of the dead band, as a function of the output mode of the dead band, the value of the low droop limiter, the value of the low dead band, the median droop gain, and the value of the low break point.

We calculate the coordinates of a third point in the case of underspeed, corresponding to the low break point of the nonlinear droop, as a function of the coordinates of the second point, the value of the low break point, the value of the low droop limiter and the median droop gain.

The coordinates of a fourth point are calculated in the case of underspeed, corresponding to the low droop limiter, as a function of the coordinates of the third point, the value of the low droop limiter and the low droop gain.

The coordinates of a fifth point are calculated in the case of underspeed, corresponding to the low limit point of the response profile, as a function of the coordinates of the fourth point and the value of the low droop limiter.

According to another embodiment, the coordinates of a first point are calculated in the case of overspeed corresponding to the high dead band and having, for the abscissa, equal to the addition of 100% of the speed measured with the value of the high dead band, and for the ordinates equal to 100% of the measured speed.

To define the dead band output, we calculate the value of a high droop gain corresponding to the ratio between the intrinsic machine droop and the desired droop, e.g. 4%.

For example, we calculate the coordinates of a second point in the case of overspeed, corresponding to the output of the dead band, as a function of the output mode of the dead band, the value of the high droop limiter, the value of the high dead band, the high droop gain, and the value of the high break point.

We calculate the coordinates of a third point in the case of overspeed, corresponding to the high break point of the nonlinear droop, as a function of the coordinates of the second point, the value of the high break point, the value of the high droop limiter and the median droop gain.

We calculate the coordinates of a fourth point in the case of overspeed, corresponding to the high break point of the nonlinear droop, as a function of the coordinates of the third point, the value of the high droop limiter and the high droop gain.

We calculate the coordinates of a fifth point in the case of overspeed, corresponding to the high limit point of the response profile, as a function of the coordinates of the fourth point and the value of the high droop limiter.

The value of the low dead band is e.g. between 0.02% and 6% of the measured speed value.

The value of the high dead band is e.g. between 0.02% and 1% of the measured speed value.

At least one of the values of the median droop, low droop and high droop is e.g. between 2% and 20% of the measured speed value.

At least one of the values of the low and high break point of the nonlinear droop is e.g. between 0% and 10% of the measured speed value.

The value of the low droop limiter is e.g. between 96% and 100% of the filtered speed value.

The value of the high droop limiter is e.g. between 100% and 104% of the filtered speed value.

According to one embodiment, the dead band output is selected from the group comprising a first output mode in which, once the extreme value of the dead band has been reached, the filtered speed reaches the speed defined by the droop, a second output mode in which, once the extreme value of the dead band reached, the filtered speed is defined by the droop while maintaining the constant offset of the dead band proportional to the measured speed, and a third output mode in which, once the extreme value of the dead band has been reached, the filtered speed reaches the speed defined by the droop while following a ramp equivalent to a droop of 2%.

BRIEF DESCRIPTION OF THE DRAWINGS

Other objects, characteristics and advantages of the invention will become apparent on reading the following description, given solely by way of nonlimiting example, with reference to the accompanying drawings, in which.

DETAILED DESCRIPTION

In the rest of the description, the "measured speed value Vm" is understood to mean the image of the frequency of the electrical grid seen by the controller, i.e. the real rotation value of the shaft line of the rotating machine. The measured speed value Vm is expressed as a percentage (%) of the speed of the power-generation group relative to the nominal speed of the rotating machine. A value of 100% speed corresponds to 50 Hz or 60 Hz depending on the country.

The power contribution to be provided by each power-generation group is defined by its own droop, i.e. the ratio between the power variation and the frequency variation of the electrical grid, expressed as a percentage (%). For example, a droop of 4% means that a variation of 4% in the speed of the rotating machine will cause a 100% variation in the nominal power of the rotating machine. Thus, an overspeed of the electrical grid of 1%, i.e. 0.5 Hz, will cause a 25% decrease in the nominal power of the rotating machine.

The droop can be adjusted between 2% and 20%. Thus, with a droop of 20%, an overspeed of the electrical grid of 1%, i.e. 0.5 Hz, will cause a 5% decrease in the nominal power of the rotating machine. Likewise, with a droop of 2%, an overspeed of the electrical grid of 1%, i.e. 0.5 Hz, will cause a 50% decrease in the nominal power of the rotating machine.

Figure 1:
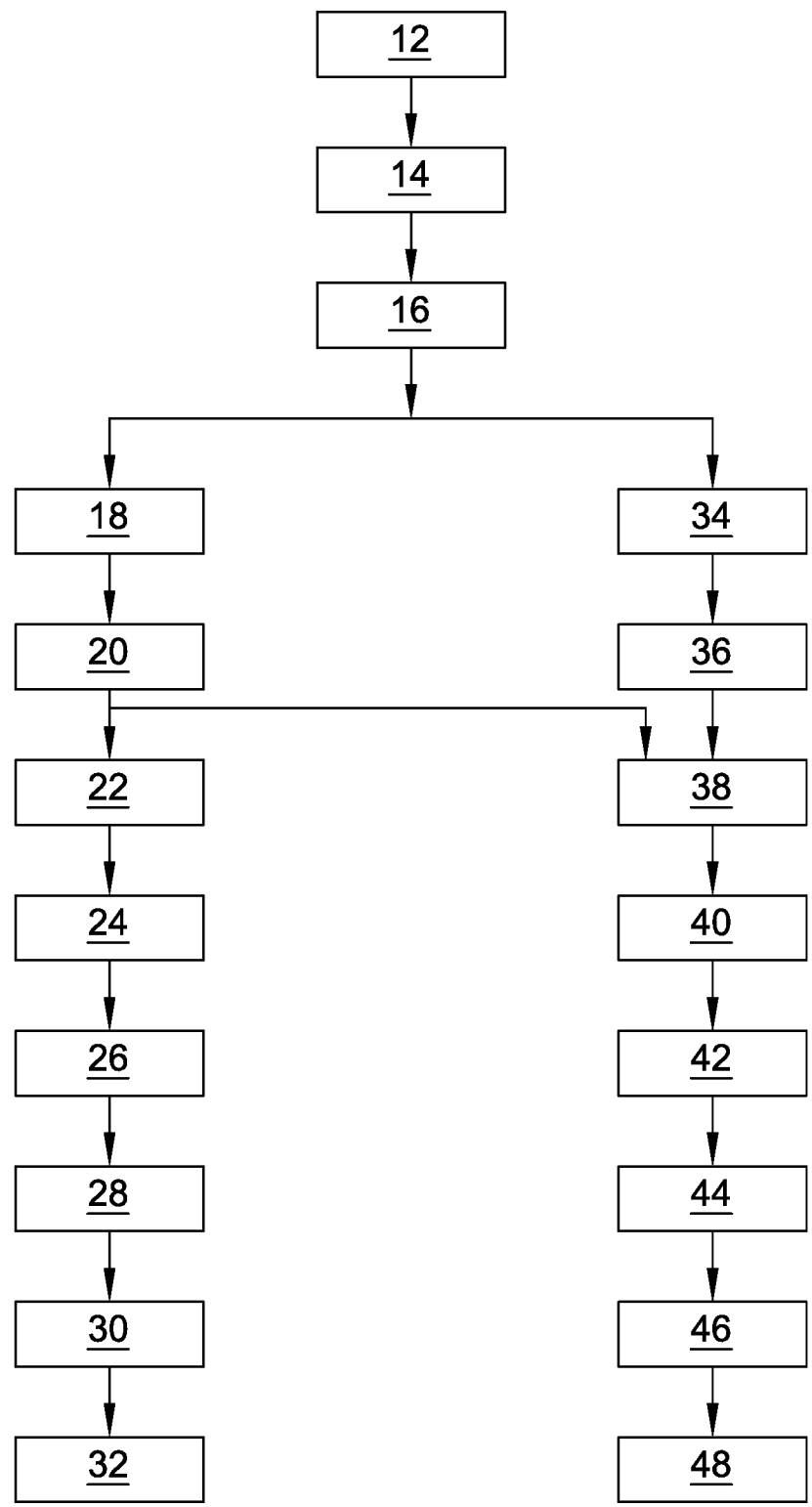
FIG. 1 illustrates a flowchart of a method for determining a droop response profile of a rotating electrical machine according to an embodiment according to the invention.

FIG. 1 shows the flowchart of a method 10 for determining a droop response profile of a rotating electrical machine of an electrical grid capable of responding to frequency variations of the electrical grid. The droop response profile is also called the speed profile or universal speed filter.

As illustrated in FIG. 1, the control method 10 of the rotating machine comprises a first step 12 for recovering a measured speed value Vm and a second step 14 for determining a plurality of droop response parameters dependent on the measured speed Vm of the rotating electrical machine.

During step 14, low and high parameters of the droop response are determined respectively corresponding to the underspeed and overspeed: the value of the low dead band LDB and the high dead band HDB, expressed as a percentage (%) of the measured speed value Vm, the value of the median droop MD, low droop LD and high droop HD, expressed as a percentage (%) of the measured speed value Vm, the value of the low droop limiter LDL and high droop limiter HDL, expressed as a percentage (%) of the measured speed value Vm, the dead band output mode for the underspeed and overspeed, selected from DBO1, DBO2, DBO3; it will also be possible to choose a different dead band output mode for underspeed and overspeed. The value of the low break point LBP and high HBP of the nonlinear droop, expressed as a percentage (%) of the measured speed value Vm.

A dead band DB is defined as an inhibition of the power response of the power-generation group in a given speed range.

We thus define three types of dead bands: a minimum dead band, applied by default, corresponding to the smallest acceptable dead band, e.g. between +/−0.02% of the measured speed value, i.e. +/−10 mHz relative to the nominal frequency. This minimum dead band makes it possible to avoid load variations of the rotating machine for small frequency variations of the electrical grid. A variable, symmetrical or asymmetrical dead band referenced to the nominal speed, e.g. between +/−1% of the measured speed value Vm, i.e. +/−500 mHz. A fixed, symmetrical or asymmetrical dead band, e.g. between −6% and 1% of the measured speed value Vm, i.e. between −3 Hz and 0.5 Hz.

The choices for the dead band DB are exclusive, i.e. if the variable dead band is enabled, then the fixed and default dead bands are disabled. Similarly, when the variable and fixed dead bands are disabled, the default dead band $DB_1$ is enabled.

The value of the low dead band LDB is e.g. between 0.02% and 6% of the measured speed value Vm.

The value of the high dead band HDB is e.g. between 0.02% and 1% of the measured speed value Vm.

The values of the median droop MD, low droop LD and high droop HD are e.g. between 2% and 20% of the measured speed value Vm.

The droop response limitation allows the limiting of the contribution of the load from a percentage value of the measured speed Vm in overspeed and/or underspeed by limiting the filtered speed to a constant value. In addition, in the case of overspeed beyond 101%, the droop response limitation is disabled to prevent operation of the rotating machine at high loads and speeds. Thus, a value of the low droop limiter LDL between e.g. 96% and 100% of the filtered speed value and a value of the high droop limiter HDL of between 100% and 104% of the filtered speed value are selected.

The dead band output DBO represents the behavior of the rotating machine at the output of the dead band DB, i.e. when the speed measured in % exceeds the predefined dead bands DB.

Thus, three dead band output modes are defined: the first output mode DBO1, called the step, in which, once the extreme value of the dead band DB has been reached, the filtered speed will have the value of the measured speed modulated according to the applied droop. The second output mode DBO2, called the rail, in which, once the extreme value of the dead band DB has been reached, the filtered speed is defined by the droop applied proportionally to the measured speed while maintaining the constant offset of the dead band. The third output mode DBO3, called the catch-up, in which, once the extreme value of the dead band DB has been reached, the filtered speed will have the value of the measured speed modulated by the applied droop while following a ramp equivalent to a droop of 2%.

Thus, in overspeed, and in underspeed, it is possible to choose the same or different dead band output modes.

The values of the low break point LBP and high break point HBP of the nonlinear droop are selected between 0% and 10% of the measured speed value.

We define a default variable droop of 4%, which is adjustable over a range between 2% and 20% applied over the entire operating range, and a non-linear droop consisting of three speed ranges with their respective droops and delimited by two inflection points on both sides of the nominal speed.

The droop response parameters may be determined either by the transmission system operator TSO, i.e. by the operator.

Some of the droop response parameters may be defined or modified by the operator and other droop response parameters may be defined in the software or controller without being modified.

Figure 2:
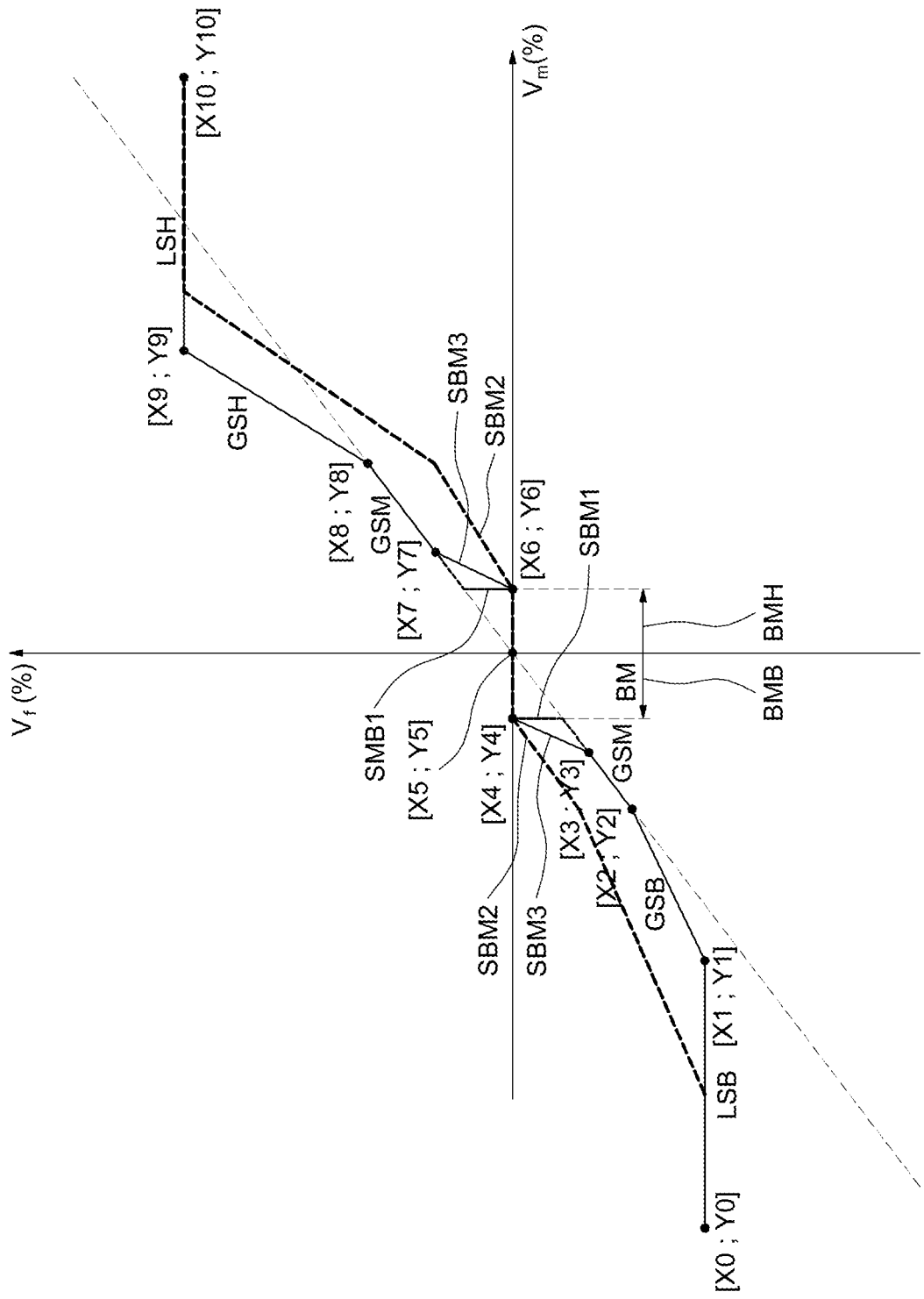
FIG. 2 shows a graph representing the set of functions of a universal speed filter determined according to the method of FIG. 1.

The method 10 then comprises a step 16 of determining the coordinates [X5; Y5] of an origin point of a graph illustrating a speed profile or droop response profile, as shown in FIG. 2. The coordinates [X5; Y5] of the origin point are written according to the following equation:

$$\begin{cases} X5 = 100\% \\ Y5 = 100\% \end{cases} \quad \text{(Eq. 1)}$$

The speed profile, shown in FIG. 2, is a graph defined by a set of coordinate points [Xi; Yi], with I being an integer between 0 and 10, having for the abscissa the value of the measured speed Vm, in %, corresponding to the image of the frequency of the electrical grid, and for the ordinates, the value of the filtered speed Vf, in %, corresponding to the measured speed Vm modulated by the droop response parameters.

The "measured speed value Vm" means the real value of rotation of the rotating machine shaft line, expressed as a percentage (%) of the speed compared to the nominal speed of the rotating machine which equals 100%.

The "filtered speed value Vf" means the speed value expressed as a percentage (%) of the speed relative to the nominal speed of the rotating machine modulated by the different droop response parameters determined in step 14.

As shown in FIG. 2, the speed profile is centered on the coordinates [X5; Y5] of the origin point corresponding to the nominal measured speed Vm of 100%. The corresponding filtered speed Vf is also 100%. Alternatively, the origin point [X5; Y5] could be adjusted in a range between 99% and 101% of the measured speed Vm.

The method 10 includes the calculation of the coordinates [X4; Y4] to [X0; Y0] from the first to the fifth points respectively in the case of underspeed and the calculation of the coordinates [X6; Y6] to [X10; Y10] from the first to the fifth points respectively in the case of overspeed.

As illustrated in FIG. 1, the method comprises steps 18 to 32 for calculating the points of the coordinates [X4; Y4] to [X0; Y0] in the case of underspeed, and steps 34 to 48 for calculating the points of the coordinates [X6; Y6] to [X10; Y10] in the case of overspeed.

In step 18, the coordinates [X4; Y4] are calculated from a first point in underspeed as a function of the low dead band LDB.

Thus, for example, in the case of underspeed not exceeding the selected low dead band LDB, the value of the filtered speed at point Y4 will correspond to the nominal speed of 100%. We obtain the coordinates [X4; Y4] of the first point according to the following equation:

$$\begin{cases} X4 = 100\% - BMB \\ Y4 = 100\% \end{cases} \quad \text{(Eq. 2)}$$

Apart from the low dead band LDB, the real speed delta corresponds to a filtered speed delta, i.e. to the measured speed delta multiplied by a droop gain. The droop gain is the ratio between the intrinsic droop of the rotating machine, e.g. equal to 4%, divided by the desired droop.

Thus, in step 20, the value of the median droop gain MDG and the value of the low droop gain LDG are calculated, as a function respectively of the median droop MD and low droop LD according to the following equations:

$$GSM = \frac{4\%}{SM} \quad \text{(Eq. 3)}$$

$$GSB = \frac{4\%}{SB} \quad \text{(Eq. 4)}$$

For example, for a desired low or median droop of between 2% and 20%, the low droop gain LDG and the median droop gain MDG will be between 2 and 0.2 respectively, e.g. equal to 1, or e.g. equal to 0.5.

In step 22, the coordinates [X3; Y3] of a second underspeed point are calculated according to the dead band output mode DBO selected in step 14.

If the step-type dead band output DBO1 was selected in step 14, the coordinates [X3; Y3] of the second point are obtained according to the following equation Eq. 5:

$$\begin{cases} X3 = X4 \\ Y3 = 100 - \text{MIN}(100 - LSB; BMB \cdot GSM) \end{cases} \quad \text{(Eq. 5)}$$

The abscissa X3 of the second point is equal to the abscissa X4 of the first point previously determined in step 18.

The ordinate Y3 of the second point is equal to 100 minus the minimum value between (100 minus the value of the low droop limiter LDL) and (the value of the low dead band LDB multiplied by the median droop gain MDG).

If the rail type dead band output DBO2 was selected in step 14, the coordinates [X3; Y3] of the second point are obtained according to the following equation Eq. 6:

$$\begin{cases} X3 = X4 \\ Y3 = Y4 \end{cases} \quad \text{(Eq. 6)}$$

The second point of coordinates [X3; Y3] is merged with the first point of coordinates [X4; Y4] previously determined in step 18.

If the catchup type dead band output DBO3 was selected in step 14 and if the value of the median droop gain value is not 2, the coordinates [X3; Y3] of the second point are obtained according to the following equation Eq. 7:

$$\begin{cases} X3 = 100 - \text{MIN}\left(\frac{100 - LSB}{2}; \frac{BMB \cdot GSM}{2 - GSM}\right) \\ Y3 = 100 - (2 \cdot (X4 - X3)) \end{cases} \quad \text{(Eq. 7)}$$

If the value of the median droop gain is equal to 2, the low dead band cannot be caught up; we take again the coordinates [X3; Y3] of the second point defined in equation Eq. 6.

In step 24, when the step-type dead band output DBO1 has been selected, the value of the low break point LBP is compared with the value of the low dead band LDB.

If the value of the low break point LBP is lower than the value of the low dead band LDB, the coordinates [X3; Y3] of the second point are recalculated according to the following equation Eq. 8:

$$\begin{cases} X3 = X4 \\ Y3 = 100 - \text{MIN}(100 - LSB; BMB \cdot GSB) \end{cases} \quad \text{(Eq. 8)}$$

In step 26, the coordinates [X2; Y2] of a third underspeed point are calculated, corresponding to the low break point of the nonlinear droop, according to the following equation Eq. 9:

$$\begin{cases} X2 = \text{MAX}\left(100 - PCB; X3 - \frac{Y3 - LSB}{GSM}\right) \\ Y2 = Y3 - (X3 - X2) \cdot GSM \end{cases} \quad \text{(Eq. 9)}$$

In step 28, the value of the abscissa X3 of the second point is compared with (100-LBP).

If the value 100−LBP is greater than the value of the abscissa X3 of the second point, the coordinates [X2; Y2] are recalculated according to the following equation Eq. 10:

$$\begin{cases} X2 = X3 \\ Y2 = Y3 \end{cases} \quad \text{(Eq. 10)}$$

In step 30, the coordinates [X1; Y1] of a fourth underspeed point are calculated, corresponding to the underspeed droop limiter, according to the following equation Eq. 11:

$$\begin{cases} X1 = \text{MAX}\left(90; X2 - \frac{Y2 - LSB}{GSB}\right) \\ Y1 = Y2 - (X2 - X1) \cdot GSB \end{cases} \quad \text{(Eq. 11)}$$

In step 32, the coordinates [X0; Y0] of a fifth underspeed point are calculated, corresponding to the underspeed limit point of the filter, according to the following equation Eq. 12:

$$\begin{cases} X0 = 90 \\ Y0 = \text{MAX}(LSB; Y1) \end{cases} \quad \text{(Eq. 12)}$$

Thus, each segment defined by two points corresponds to a function modulated by the functions which precede it.

Steps 34 to 48 represent the steps for calculating the points of coordinates [X6; Y6] to [X10; Y10] in the case of overspeed.

In step 34, the coordinates [X6; Y6] are calculated from a first point in overspeed as a function of the high dead band HDB.

Thus, for example, in the case of overspeed not exceeding the selected high dead band HDB, the value of the filtered speed at point Y6 will correspond to the nominal speed of 100%. We obtain the coordinates [X6; Y6] of the first point according to the following equation:

$$\begin{cases} X6 = 100\% + BMH \\ Y6 = 100\% \end{cases} \quad \text{(Eq. 13)}$$

Apart from the high dead band HDB, the real speed delta corresponds to a filtered speed delta, i.e. to the measured speed delta multiplied by a droop gain. The droop gain is the ratio between the intrinsic droop of the rotating machine, e.g. equal to 4%, divided by the desired droop.

Thus, the value of the median droop gain MDG calculated in step 20 is applied.

In step 36, the value of the high droop gain HDG is calculated as a function of the high droop HD according to the following equation:

$$GSH = \frac{4\%}{SH} \quad \text{(Eq. 14)}$$

For example, for a desired high droop of between 2% and 20%, the high droop gain HDG will be between 2 and 0.2.

In step 38, the coordinates [X7; Y7] of a second overspeed point are calculated according to the dead band output mode DBO determined in step 14.

If the step-type dead band output DBO1 was selected in step 14, the coordinates [X7; Y7] of the second point are obtained according to the following equation Eq. 15:

$$\begin{cases} X7 = X6 \\ Y7 = 100 + \text{MIN}(LSH - 100;\ BMH \cdot GSM) \end{cases} \quad \text{(Eq. 15)}$$

The abscissa X7 of the second point is equal to the abscissa X6 of the first point previously determined in step 34.

The ordinate Y7 of the second point is equal to 100 plus the minimum value between (the value of the high droop limiter HDL minus 100) and (the value of the high dead band HDB multiplied by the median droop gain MDG calculated in step 20).

If the rail type dead band output DBO2 was selected in step 14, the coordinates [X7; Y7] of the second point are obtained according to the following equation Eq. 16:

$$\begin{cases} X7 = X6 \\ Y7 = Y6 \end{cases} \quad \text{(Eq. 16)}$$

The second point of coordinates [X7; Y7] is merged with the first point of coordinates [X6; Y6] previously determined in step 34.

If the catchup type dead band output DBO3 was selected in step 14 and if the value of the median droop gain value is not 2, the coordinates [X7; Y7] of the second point are obtained according to the following equation Eq. 17:

$$\begin{cases} X7 = 100 + \text{MIN}\left(\dfrac{LSH - 100}{2};\ \dfrac{BMH \cdot GSM}{2 - GSM}\right) \\ Y7 = 100 + (2 \cdot (X7 - X6)) \end{cases} \quad \text{(Eq. 17)}$$

If the value of the median droop gain is equal to 2, the high dead band HDB cannot be caught up; we take again the coordinates [X7; Y7] of the second point defined in equation Eq. 16.

In step 40, when the step-type dead band output DBO1 has been selected, the value of the high break point HBP is compared with the value of the high dead band HDB.

If the value of the high break point HBP is lower than the value of the high dead band HDB, the coordinates [X7; Y7] of the second point are recalculated according to the following equation Eq. 18:

$$\begin{cases} X7 = X6 \\ Y7 = 100 + \text{MIN}(LSH;\ BMH \cdot GSH) \end{cases} \quad \text{(Eq. 18)}$$

In step 42, the coordinates [X8; Y8] of a third overspeed point are calculated, corresponding to the high break point of the nonlinear droop, according to the following equation Eq. 19:

$$\begin{cases} X8 = \text{MIN}\left(100 + PCH;\ X7 + \dfrac{LSH - Y7}{GSM}\right) \\ Y8 = Y7 + (X8 - X7) \cdot GSM \end{cases} \quad \text{(Eq. 19)}$$

In step 44, the value of the abscissa X7 of the second point is compared with (100+HBP).

If the value 100+HBP is lower than the value of the abscissa X7, the coordinates [X8; Y8] of the third point are recalculated according to the following equation Eq. 20:

$$\begin{cases} X8 = X7 \\ Y8 = Y8 \end{cases} \quad \text{(Eq. 20)}$$

In step 46, the coordinates [X9; Y9] of a fourth point are calculated, corresponding to the overspeed droop limiter, according to the following equation Eq. 21:

$$\begin{cases} X9 = \text{MIN}\left(110;\ X8 - \dfrac{LSH - Y8}{GSH}\right) \\ Y9 = Y8 + (X9 - X8) \cdot GSH \end{cases} \quad \text{(Eq. 21)}$$

In step 48, the coordinates [X10; Y10] of a fifth point are calculated, corresponding to the overspeed limit point of the filter, according to the following equation Eq. 22:

$$\begin{cases} X10 = 110 \\ Y10 = \text{MIN}(LSH;\ Y9) \end{cases} \quad \text{(Eq. 22)}$$

Thus, each segment defined by two points corresponds to a function modulated by the functions which precede it.

As illustrated in FIG. 2, the dead band output, beyond the point of coordinates [X4; Y4] in the case of underspeed and beyond the point of coordinates [X6; Y6] in the case of overspeed, has three possible functions. These different modes make it possible to obtain distinct speed profiles. FIG. 2 shows, in solid lines, the so-called catch-up mode of the dead band DBO3, in fine dashed lines, the so-called step output mode of the dead band DBO1, and in bold lines-dashes, the so-called rail output mode of the dead band DBO2.

In rail mode, the point of coordinates [X7; Y7] of the dead band output is merged with the point of coordinates [X6; Y6]

defining the overspeed dead band. Similarly, for underspeed, the output point of the dead band of the coordinates [X3; Y3] is merged with the point defining the dead band of the coordinates [X4; Y4]. Thus, outside the dead band, a filtered rate delta corresponds to a measured speed delta multiplied by the droop gain.

In catchup mode, the dead band output is defined in overspeed by the segment of the coordinates [X6; Y6] and [X7; Y7] corresponding to the segment between the first and second points, or in underspeed by the segment of the coordinates [X4; Y4] and [X3; Y3] corresponding to the segment between the first and second points.

The filtered speed catches up with the real speed modulated by the droop gain following a ramp equivalent to a droop of 2%.

In step mode, the dead band output is defined in overspeed by the segment of the coordinates [X6; Y6] and [X7; Y7] corresponding to the segment between the first and second points, or in underspeed by the segment of the coordinates [X4; Y4] and [X3; Y3] corresponding to the segment between the first and second points. The filtered speed catches up with the real speed modulated by the droop gain following a step from the point of coordinates [X6; Y6] in overspeed or from the point of coordinates [X4; Y4] in underspeed.

Thus, the two segments defined respectively by the coordinates [X7; Y7], [X8; Y8] the second and third point and by the coordinates [X8; Y8], [X9; Y9] of the third and fourth point for the overspeed, or the two segments defined respectively by the coordinates [X3; Y3], [X2; Y2] of the second and third point and the coordinates [X2; Y2], [X1; Y1] of the third and fourth point for the underspeed, combine two functions related to the droop, namely: the non-linear droop: between the points of coordinates [X7; Y7] and [X8; Y8], the median droop gain is applied, and between the points of coordinates [X8; Y8] and [X9; Y9], the high droop gain is applied. The point of coordinates [X8; Y9] corresponds to the break point between the two droop segments; the variable droop: in this case, the median and high droop gains are equal, which amounts to a single segment between the points of coordinates [X7; Y7] and [X9; Y9] in the case of overspeed, or between the points of coordinates [X3; Y3] and [X1; Y1] in the case of underspeed.

The segment defined by the points of coordinates [X9; Y9] and [X10; Y10] represents the high droop limiter, the zone in which the filtered speed is constant regardless of the variation of the real measured speed.

The segment defined by the points of coordinates [X1; Y1] and [X0; Y0] represents the low droop limiter, the zone in which the filtered speed is constant regardless of the variation of the real measured speed.

The graph illustrated in FIG. 2 shows all the functions of a universal speed filter obtained by the method described with reference to FIG. 1.

Figure 3:
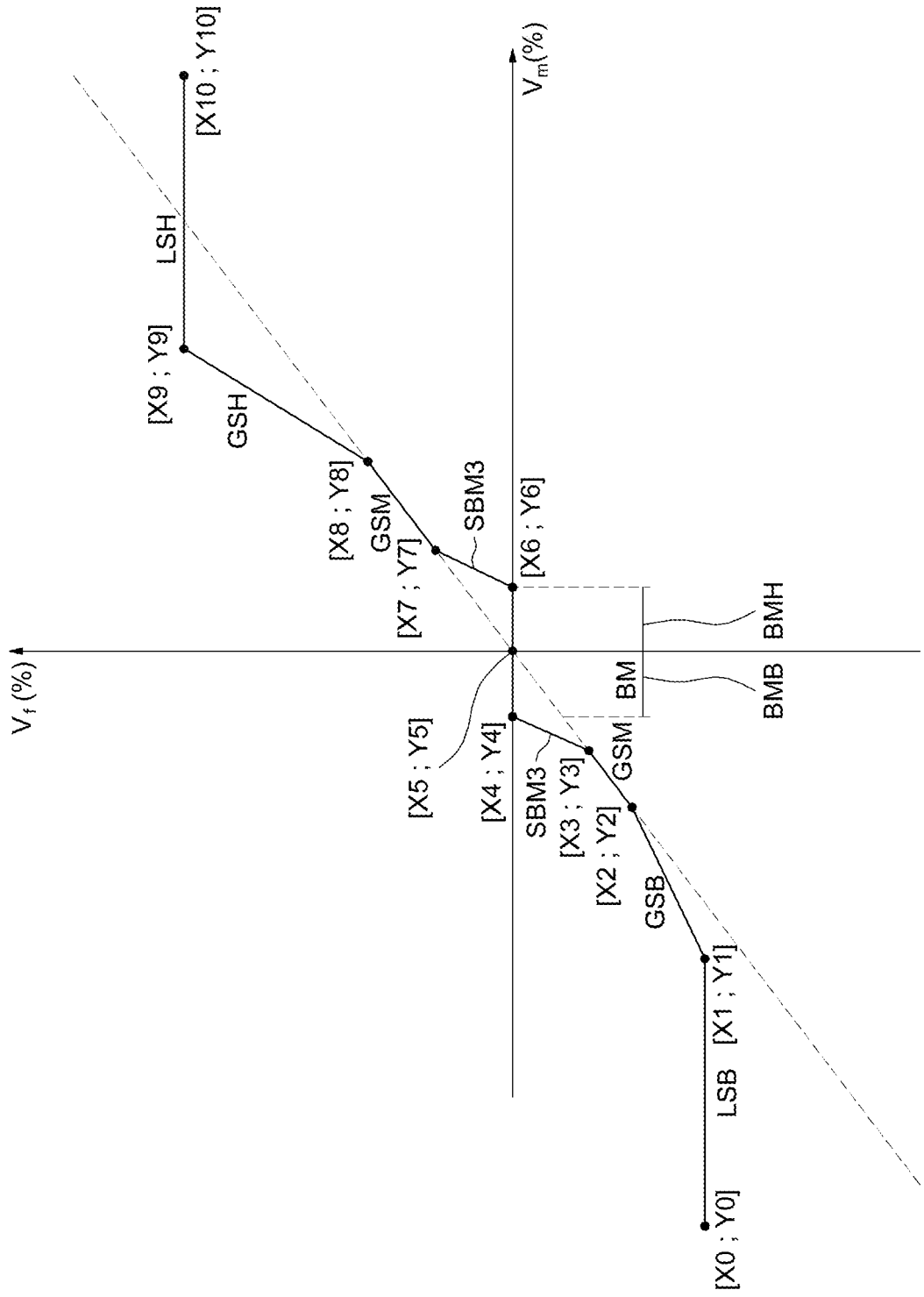
FIG. 3 shows in detail an example application of the universal speed filter of FIG. 2.

FIG. 3 illustrates a particular case of the universal filter of FIG. 2, in which we have selected an output mode of the dead band in catchup type mode. All the points of coordinates [X4; Y4] to [X0; Y0] in the case of underspeed, and the points of coordinates [X6; Y6] to [X10; Y10] in the case of overspeed, are calculated according to steps 18-48 described above.

As soon as the determination method illustrated in FIG. 1 has created the droop response profile or universal speed profile illustrated in FIG. 2, it can be displayed on a human-machine interface (HMI). We could also display, in this human-machine interface, a theoretical power response profile, corresponding to the displayed universal speed profile. It is noted that the coordinates of points of this power response profile are obtained from the coordinates of points of the universal speed profile and based on the relationship between the filtered speed variation and the power variation inherent in the droop definition.

In the method according to an embodiment of the invention, provision could be made for a limitation to a minimum power defined by the operator who uses the droop limiter. The difference between the real power and the minimum power is then converted to an authorized variation to define this limitation.

In general, the method according to an embodiment of the invention allows the integration of a plurality of functions related to the measured speed, e.g. in particular the value of the dead band and the value of the droop. From this, the method constructs a universal speed profile, also called a universal droop response profile or universal speed filter. This universal speed profile according to the method of in an embodiment thus obtained in various ways: either all the parameters of the frequency response are preset, e.g. specified in the transmission network operator or determined by the central operator, or some or all of frequency response parameters are non-existent or not specified, then the universal speed profile is developed using default settings, e.g. a default dead band of 10 mHz, a rail-type dead band output and/or a droop equal to 4%, i.e. the parameters are defined in the previous two ways.

Thanks to the method described, if we select the different parameters in overspeed and underspeed, the speed profile determined will be asymmetrical around the origin point of the coordinates [X5; Y5]. It is thus possible to obtain a different behavior of the rotating electrical machine in overspeed and in underspeed. The asymmetry is particularly interesting for markets where the responses in overspeed and underspeed represent different products and services.

Thanks to an embodiment of the invention, the method can automatically and independently calculate the points of coordinates [X0; Y0] to [X4; Y4] in underspeed relative to the nominal speed, and the points of coordinates [X6; Y6] to [X10; Y10] in overspeed relative to the nominal speed.

The independence of the calculation allows the asymmetry of the droop profile to be obtained.

In addition, the simultaneous calculation of the coordinates of the points makes it easy to integrate the changes in the droop response parameters. In the event of a change in a parameter, e.g. in the network manager, the method can thus recalculate all the coordinates of the points defining the universal speed profile, which makes the method according to an embodiment of the invention particularly flexible. Indeed, thanks to the method according to an embodiment of the invention, when at least one of the droop response parameters changes, the method adjusts or changes this parameter and automatically recalculates all the coordinates of the points defining the universal speed filter.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What we claim is:

1. A method of determining a droop response profile of a rotating electrical machine supplying electricity to an electrical grid having a grid frequency varying on either side of a nominal frequency, the method comprising:
retrieving a measured value for a rotating speed of the rotating machine corresponding to an image of the electrical grid frequency, and;
retrieving droop response parameters dependent on the measured speed value;
determining an origin point of coordinates between 99% and 101% of the measured speed, wherein the droop response profile is a graph centered on the origin;
defining the graph by at least two points of coordinates, in the case of underspeed and at least two points of coordinates, in the case of overspeed, each of the points having for its abscissa a speed value as a percentage of the measured speed, and for its ordinates a filtered speed value as a percentage of the measured speed modulated by at least one of the droop response parameters, said parameters comprising at least the value of a high dead band and a low dead band on either side of the origin point, the value of a low, median and high droop of the rotating machine, the value of a low and high droop limiter, at least one dead band output mode, and the value of a low and high break point of the nonlinear droop; and
displaying the droop response profile on a human-machine interface, wherein the rotating electrical machine is operable in accordance with the droop response profile to respond to a change in frequency of the electrical grid,
wherein coordinates of a first point are calculated in the case of underspeed, corresponding to the low dead band, having an abscissa equal to the subtraction of 100% of the measured speed from the value of the low dead band, and having the ordinates equal to 100% of the measured speed,
wherein the value of a median droop gain and the value of a low droop gain is calculated, corresponding to the ratio between the intrinsic droop of the rotating machine, e.g. 4%, and the desired median droop and low droop respectively, and
wherein coordinates of a second point are calculated in the case of underspeed, corresponding to the output of the dead band, as a function of the dead band output mode (DBO), the value of the low droop limiter, the value of the low dead band, the median droop gain, and the value of the low break point.

2. The method according to claim 1, wherein coordinates of a third point are calculated in the case of underspeed, corresponding to the low break point of the nonlinear droop, as a function of the coordinates of the second point, the value of the low break point, the value of the low droop limiter and the median droop gain.

3. The method according to claim 2, wherein coordinates of a fourth point are calculated in the case of underspeed, corresponding to the low droop limiter, as a function of the coordinates of the third point, the value of the low droop limiter and the low droop gain.

4. The method according to claim 3, wherein coordinates of a fifth point are calculated in the case of underspeed, corresponding to the low limit point of the response profile, as a function of the coordinates of the fourth point and the value of the low droop limiter.

5. The method according to claim 1, wherein the coordinates of a first point are calculated in the case of overspeed, corresponding to the high dead band, having an abscissa equal to the addition of 100% of the measured speed from the value of the high dead band, and having the ordinates equal to 100% of the measured speed.

6. The method according to claim 5, wherein the value of a high droop gain is calculated, corresponding to the ratio between the intrinsic droop of the rotating machine, e.g. 4%, and the desired high droop.

7. The method according to claim 6, wherein the coordinates of a second point are calculated in the case of overspeed, corresponding to the output of the dead band, as a function of the output mode of the dead band, the value of the high droop limiter, the value of the high dead band, the high droop gain, and the value of the high break point.

8. The method according to claim 7, wherein the coordinates of a third point are calculated in the case of overspeed, corresponding to the high break point of the nonlinear droop, as a function of the coordinates of the second point in the case of overspeed, the value of the high break point, the value of the high droop limiter and the median droop gain.

9. The method according to claim 8, wherein the coordinates of a fourth point are calculated in the case of overspeed, corresponding to the high droop limiter, as a function of the coordinates of the third point in the case of overspeed, the value of the high droop limiter and the high droop gain.

10. The method according to claim 9, wherein the coordinates of a fifth point are calculated in the case of overspeed, corresponding to the limit point of the response profile, as a function of the coordinates of the fourth point in the case of overspeed and the value of the high droop limiter.

11. The method according to claim 1, wherein the value of the low dead band is between 0.02% and 6% of the measured speed value.

12. The method according to claim 1, wherein the value of the high dead band is between 0.02% and 1% of the measured speed value.

13. The method according to claim 1, wherein the values of the median droop, the low droop and the high droop are between 2% and 20% of the measured speed value.

14. The method according to claim 1, wherein the values of the low break point and high break point of the nonlinear droop are selected between 0% and 10% of the measured speed value.

15. The method according to claim 1, wherein the value of the low droop limiter is between 96% and 100% of the filtered speed value.

16. The method according to claim 1, wherein the value of the high droop limiter is between 100% and 104% of the filtered speed value.

17. A method of determining a droop response profile of a rotating electrical machine supplying electricity to an electrical grid having a grid frequency varying on either side of a nominal frequency, the method comprising:
retrieving a measured value for a rotating speed of the rotating machine corresponding to an image of the electrical grid frequency, and;
retrieving droop response parameters dependent on the measured speed value;
determining an origin point of coordinates between 99% and 101% of the measured speed, wherein the droop response profile is a graph centered on the origin;
defining the graph by at least two points of coordinates, in the case of underspeed and at least two points of coordinates, in the case of overspeed, each of the points having for its abscissa a speed value as a percentage of the measured speed, and for its ordinates a filtered speed value as a percentage of the measured speed modulated by at least one of the droop response parameters, said parameters comprising at least the value of a high dead band and a low dead band on either side of the origin point, the value of a low, median and high droop of the rotating machine, the value of a low and high droop limiter, at least one dead band output mode, and the value of a low and high break point of the nonlinear droop; and displaying the droop response profile on a human-machine interface, wherein the rotating electrical machine is operable in accordance with the droop response profile to respond to a change in frequency of the electrical grid, wherein the dead band output is selected from the group comprising a first output mode in which, once the extreme value of the dead band has been reached, the filtered speed reaches the speed defined by the droop, a second output mode in which, once the extreme value of the dead band reached, the filtered speed is defined by the droop while maintaining the constant compensation of the dead band proportional to the measured speed, and a third output mode in which, once the extreme value of the dead band has been reached, the filtered speed reaches the speed defined by the droop while following a ramp equivalent to a droop of 2%.

* * * * *